United States Patent
Miyazawa

(10) Patent No.: US 9,171,776 B2
(45) Date of Patent: Oct. 27, 2015

(54) SEMICONDUCTOR COOLING DEVICE

(71) Applicant: Mitsubishi Electric Corporation, Tokyo (JP)

(72) Inventor: Masaomi Miyazawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/706,850

(22) Filed: May 7, 2015

(65) Prior Publication Data

US 2015/0243581 A1    Aug. 27, 2015

Related U.S. Application Data

(63) Continuation of application No. 14/145,310, filed on Dec. 31, 2013.

(30) Foreign Application Priority Data

Apr. 24, 2013   (JP) ................. 2013-090875

(51) Int. Cl.
*H01L 23/367* (2006.01)
*H01L 23/46* (2006.01)
*H01L 23/473* (2006.01)
*H01L 23/34* (2006.01)
*H01L 23/467* (2006.01)
*H01L 23/36* (2006.01)
*H01L 23/427* (2006.01)

(52) U.S. Cl.
CPC ............ *H01L 23/46* (2013.01); *H01L 23/3675* (2013.01); *H01L 23/34* (2013.01); *H01L 23/36* (2013.01); *H01L 23/3672* (2013.01); *H01L 23/427* (2013.01); *H01L 23/467* (2013.01); *H01L 23/473* (2013.01); *H01L 23/4735* (2013.01)

(58) Field of Classification Search
CPC ..... H01L 23/34; H01L 23/36; H01L 23/3672; H01L 23/46; H01L 23/467; H01L 23/427; H01L 23/473; H01L 23/4735
See application file for complete search history.

(56) References Cited

U.S. PATENT DOCUMENTS

| 7,215,545 B1 | 5/2007 | Moghaddam et al. |
| 2007/0045801 A1 | 3/2007 | Sugiyama et al. |
| 2009/0145581 A1 | 6/2009 | Hoffman et al. |
| 2010/0172091 A1 | 7/2010 | Nishiura |
| 2010/0315780 A1 | 12/2010 | Murakami |
| 2013/0160485 A1 | 6/2013 | Teraki |

FOREIGN PATENT DOCUMENTS

| JP | 2001-053207 A | 2/2001 |
| JP | 2007-067228 A | 3/2007 |

*Primary Examiner* — Peniel M Gumedzoe
(74) *Attorney, Agent, or Firm* — Studebaker & Brackett PC

(57) ABSTRACT

A semiconductor cooling device includes: a cooling medium flow channel, through which a cooling medium for cooling a semiconductor chip flows; a laminar flow section which is provided in a region upstream of the cooling medium flow channel and allows the cooling medium to flow in the form of laminar flow; and a turbulent flow section which is provided in a region downstream of the laminar flow section in the cooling medium flow channel and allows the cooling medium, which flows in the form of laminar flow from the laminar flow section, to flow in the form of turbulent flow.

18 Claims, 3 Drawing Sheets

SEMICONDUCTOR COOLING DEVICE

BACKGROUND OF THE INVENTION

1. Field of the Invention

The present invention relates to improvement in reliability of a semiconductor cooling device which cools a semiconductor chip mounted in a power semiconductor device used for a power converter, a switching power supply or the like.

2. Description of the Background Art

A capacity of the power semiconductor device used for the power converter, the switching power supply or the like is on the increase year by year, and a semiconductor chip (e.g., IGBT (insulated gate bipolar transistor)) mounted in the power semiconductor device is electrified and used with a higher current density, whereby there have been challenges of taking a heat radiation measure and extending a power cycle life. In particular, development of a semiconductor device is recently proceeding, the device being operated at a high speed by use of a compound semiconductor (SiC, GaN, etc.) with a high heatproof temperature for a semiconductor element, and a heat radiation measure therefor is becoming increasingly important.

For example, Japanese Patent Application Laid-Open No. 2007-67228 discloses a circuit board where a cooling medium channel (cooling medium flow channel) is provided inside a board mounted with a semiconductor chip and the board is cooled by use of a cooling medium that flows through the cooling medium channel to cool the heated semiconductor chip.

However, in the circuit board described in Japanese Patent Application Laid-Open No. 2007-67228, every region of the cooling medium flow channel provided inside the board is uniform, and hence a temperature of the cooling medium becomes higher in an outlet-side region of the cooling medium flow channel than in an inlet-side region thereof, thus generating a difference in temperature of the cooling medium between the inlet-side region and the outlet-side region. For this reason, the semiconductor device including the semiconductor chip cannot be uniformly cooled, thereby causing problems such as a problem of increasing a difference in thermal stress based on the temperature difference in the semiconductor device to shorten a power cycle life of the semiconductor device.

SUMMARY OF THE INVENTION

An object of the present invention is to provide a semiconductor cooling device capable of improving cooling efficiency to seek for a longer life of a semiconductor device.

A semiconductor cooling device according to the present invention is a semiconductor cooling device for cooling a semiconductor chip mounted with an insulating layer being interposed therebetween, the semiconductor cooling device including: a cooling medium flow channel, through which a cooling medium for cooling the semiconductor chip flows; a laminar flow section which is provided in a region upstream of the cooling medium flow channel and allows the cooling medium to flow in the form of laminar flow; and a turbulent flow section which is provided in a region downstream of the laminar flow section in the cooling medium flow channel and allows the cooling medium, which flows in the form of laminar flow from the laminar flow section, to flow in the form of turbulent flow.

According to the present invention, the semiconductor cooling device includes the cooling medium flow channel, through which the cooling medium for cooling the semiconductor chip flows; the laminar flow section which is provided in the region upstream of the cooling medium flow channel and allows the cooling medium to flow in the form of laminar flow; and the turbulent flow section which is provided in the region downstream of the laminar flow section in the cooling medium flow channel and allows the cooling medium, which flows in the form of laminar flow from the laminar flow section, to flow in the form of turbulent flow.

Therefore, in the cooling medium flow channel, a temperature of the cooling medium becomes higher in the turbulent flow section as the downstream region than the laminar flow section as the upstream region, but by forming the cooling medium that flows through the laminar flow section into laminar flow, while forming the cooling medium that flows through the turbulent flow section into turbulent flow, heat transmission to the cooling medium is promoted in the turbulent flow section, whereby the upstream and the downstream of the cooling medium flow channel can be uniformly cooled, so as to enhance the cooling efficiency for the semiconductor cooling device. Since the semiconductor device including the semiconductor chip can be uniformly cooled in such a manner, the difference in thermal stress based on the temperature difference in the semiconductor device becomes small, thus making it possible to extend a power cycle life, and further to seek for a longer life of the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
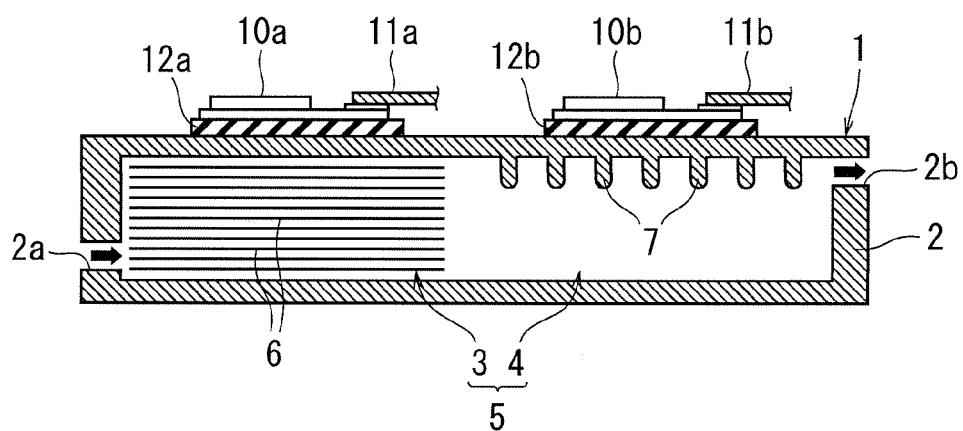
FIG. 1 is a sectional view of a semiconductor device provided with a semiconductor cooling device according to a first preferred embodiment.

A first preferred embodiment of the present invention will be described below with reference to the drawings. FIG. 1 is a sectional view of a semiconductor device provided with a semiconductor cooling device 1 according to the first preferred embodiment. The semiconductor device is provided with semiconductor chips 10a, 10b and the semiconductor cooling device 1.

First, the semiconductor chips 10a, 10b will be briefly described. Each of the semiconductor chips 10a, 10b is, for example, an IGBT and formed by use of Si or a wide band gap semiconductor (such as SiC and GaN). As shown in FIG. 1, for example, a plurality of (two) semiconductor chips 10a, 10b are mounted side by side in a lateral direction on the top surface of the metal semiconductor cooling device 1.

More specifically, the semiconductor chip 10a is mounted on the top surface of the metal semiconductor cooling device 1 with an insulating layer 12a being interposed therebetween, and a wiring layer 11a is mounted on the top surface of the semiconductor cooling device 1 with the insulating layer 12a being interposed therebetween. Further, the semiconductor chip 10b is mounted on the top surface of the metal semiconductor cooling device 1 with an insulating layer 12b being interposed therebetween, and a wiring layer 11b is mounted on the top surface of the semiconductor cooling device 1 with the insulating layer 12b being interposed therebetween.

Next, the semiconductor cooling device 1 will be described. The semiconductor cooling device 1 is a device for cooling the semiconductor chips 10a, 10b mounted on the top surface of the semiconductor cooling device 1, and includes a metal base board 2, a cooling medium flow channel 5, a laminar flow section 3, and a turbulent flow section 4. The cooling medium flow channel 5, through which a cooling medium (such as water) flows, is formed inside the base board 2. One side wall (left-side side wall in FIG. 1) of the base board 2 is formed with an inlet 2a for communicating with the cooling medium flow channel 5 and allowing the cooling medium to flow from the outside into the cooling medium flow channel 5, and another one side wall (right-side side wall in FIG. 1) of the base board 2 is formed with an outlet 2b for communicating with the cooling medium flow channel 5 and discharging the cooling medium, having flown through the cooling medium flow channel 5, to the outside.

The inlet 2a is connected with the outlet 2b by, for example, a cooling medium circulation channel (not shown), which is provided with cooling medium supply means (not shown) and cooling means (not shown), and by activation of the supply means, the cooling medium cooled by use of the cooling means flows from the inlet 2a into the cooling medium flow channel 5.

Next, the laminar flow section 3 and the turbulent flow section 4 will be described. The laminar flow section 3 is formed in a region upstream of the cooling medium flow channel 5, more specifically in a region upstream of the cooling medium flow channel 5, which includes a peripheral region of the inlet 2a. In the laminar flow section 3, for example, a plurality of platy laminar flow members 6 extending in a horizontal direction are arranged in parallel with each other at previously set intervals in a vertical direction such that the cooling medium can flow. In FIG. 1, for example, the laminar flow members 6 are formed from the front side to the rear side in the laminar flow section 3, while being formed in the laminar flow section 3 from the inlet 2a-side peripheral region to a boundary with the turbulent flow section 4. The cooling medium having been allowed to flow from the inlet 2a is formed into laminar flow by flowing between a plurality of laminar flow members 6.

The turbulent flow section 4 is formed in a region downstream of the laminar flow section 3 in the cooling medium flow channel 5, more specifically in a region downstream of the cooling medium flow channel 5 which includes a peripheral region of the outlet 2b. The turbulent flow section 4 is formed with a plurality of projections 7 projecting downward, for example in a region of the semiconductor chip 10b-mounted side in the turbulent flow section 4, and more specifically from the upper-side inner wall in the turbulent flow section 4. In FIG. 1, for example, the plurality of projections 7 are formed from the front side to the rear side in the turbulent flow section 4 at previously set intervals, while being formed in the turbulent flow section 4 from the boundary with the laminar flow section 3 to the outlet 2b-side peripheral region at previously set intervals.

The cooling medium having been allowed to flow in the form of laminar flow from the laminar flow section 3 is collided with the plurality of projections 7 in the turbulent flow section 4, to be formed into turbulent flow. It is to be noted that in the turbulent flow section 4, the cooling medium may only be allowed to flow in the form of turbulent flow, and the plurality of projections 7 may each be arranged at random, or the number of projections 7 may not be restricted to plural but may be one.

Heats generated from the semiconductor chips 10a, 10b are transmitted to the semiconductor cooling device 1 via insulating layers 12a, 12b, and transmitted from the inner surfaces of the laminar flow section 3 and the turbulent flow section 4 to the cooling medium that flows through the laminar flow section 3 and the turbulent flow section 4. Accordingly, the heats generated from the semiconductor chips 10a, 10b can be radiated.

By transmission of the heats generated from the semiconductor chips 10a, 10b to the cooling medium having flown through the laminar flow section 3, the temperature of the cooling medium having been allowed to flow in the form of laminar flow from the laminar flow section 3 becomes high as compared with that of the cooling medium having been allowed to flow thereinto from the inlet 2a. However, the cooling medium is collided with the plurality of projections 7 in the turbulent flow section 4, thereby to flow in the form of turbulent flow through the turbulent flow section 4, and hence in the turbulent flow section 4, heat transmission from the inner surface of the turbulent flow section 4 to the cooling medium is promoted, making the cooling efficiency in the turbulent flow section 4 higher than the cooling efficiency in the laminar flow section 3. This makes it possible to uniformly cool the upstream and downstream of the cooling medium flow channel 5.

As thus described, the semiconductor cooling device 1 according to the first preferred embodiment includes the cooling medium flow channel 5, through which the cooling medium for cooling the semiconductor chips 10a, 10b flows; the laminar flow section 3 which is provided in the region upstream of the cooling medium flow channel 5 and allows the cooling medium to flow in the form of laminar flow; and the turbulent flow section 4 which is provided in the region downstream of the laminar flow section 3 in the cooling medium flow channel 5 and allows the cooling medium, which flows in the form of laminar flow from the laminar flow section 3, to flow in the form of turbulent flow.

Therefore, in the cooling medium flow channel 5, the temperature of the cooling medium becomes higher in the turbulent flow section 4 as the downstream region than the laminar flow section 3 as the upstream region, but by forming the cooling medium that flows through the laminar flow section 3 into laminar flow, while forming the cooling medium that flows through the turbulent flow section 4 into turbulent flow, heat transmission to the cooling medium is promoted in the turbulent flow section 4, whereby the upstream and the downstream of the cooling medium flow channel 5 can be uniformly cooled, so as to enhance the cooling efficiency for the semiconductor cooling device 1. Since the semiconductor device including the semiconductor chips 10a, 10b can be uniformly cooled in such a manner, the difference in thermal stress based on the temperature difference in the semiconductor device becomes small, thus making it possible to extend a power cycle life, and further to seek for a longer life of the semiconductor device.

Further, provision of the projections 7 in the region of the semiconductor chip 10b-mounted side in the turbulent flow section 4 leads to a large surface area of the turbulent flow section 4, thus making it possible to reduce thermal resistance and also facilitate formation of the cooling medium, having been allowed to flow in the form of laminar flow from the laminar flow section 3, into turbulent flow.

Moreover, when the semiconductor chips 10a, 10b are formed by use of the wide band gap semiconductor, those are used at a higher temperature than in the case of being formed by use of Si, and hence it is possible to effectively cool the semiconductor chips 10a, 10b by use of the semiconductor cooling device 1.

Furthermore, since the turbulent flow section 4 may only be provided with respect to the conventional structure, the manufacturing process of the semiconductor cooling device 1 does not become complicated, thus making it possible to seek for improvement in yield of the semiconductor cooling device 1, and further for improvement in yield of the semiconductor device.

Figure 2:
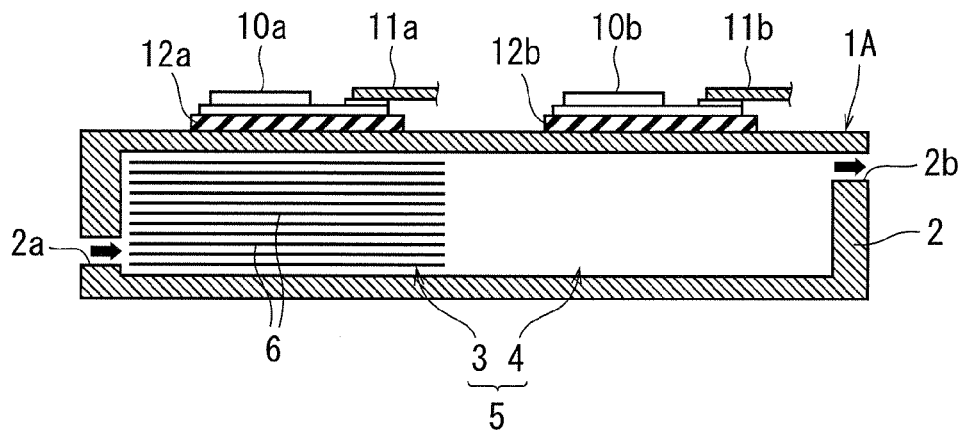
FIG. 2 is a sectional view of a semiconductor device provided with a semiconductor cooling device according to a modified example of the first preferred embodiment.

In addition, as shown in FIG. 2, the projections 7 may be omitted in the turbulent flow section 4. FIG. 2 is a sectional view of a semiconductor device provided with a semiconductor cooling device 1A according to a modified example of the first preferred embodiment. In this case, the cooling medium having been allowed to flow in the form of laminar flow from the laminar flow section 3 interferes in the turbulent flow section 4 and flows in the form of turbulent flow. Accordingly, the difference in thermal stress based on the temperature difference in the semiconductor device becomes small, thus making it possible to extend a power cycle life, and further to seek for a longer life of the semiconductor device. Moreover, since there is no need for forming the projections 7, the manufacturing process of the semiconductor cooling device 1A is simplified more than that of the semiconductor cooling device 1, and it is thus possible to seek for improvement in yield of the semiconductor cooling device 1A, and further for improvement in yield of the semiconductor device.

Second Preferred Embodiment

Figure 3:
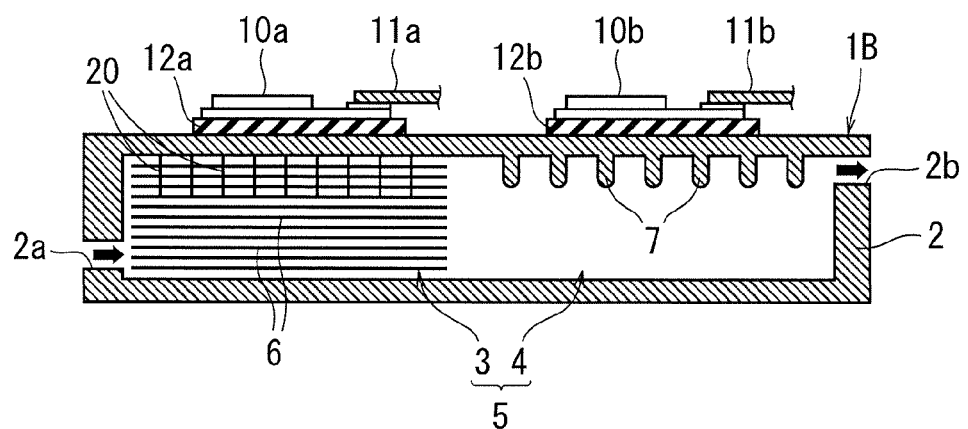
FIG. 3 is a sectional view of a semiconductor device provided with a semiconductor cooling device according to a second preferred embodiment.

Next, a semiconductor cooling device 1B according to a second preferred embodiment will be described. FIG. 3 is a sectional view of a semiconductor device provided with the semiconductor cooling device 1B according to the second preferred embodiment. It should be noted that in the second preferred embodiment, the same constitutional elements as those described in the first preferred embodiment are provided with the same reference numerals and the descriptions thereof will be omitted.

In the semiconductor cooling device 1B according to the second preferred embodiment, a mesh laminar flow member 20 is provided in the laminar flow section 3. More specifically, in a region of the upper side (semiconductor chip 10a-mounted side) in the laminar flow section 3, the mesh laminar flow member 20 is arranged, and in the other region in the laminar flow section 3, a plurality of laminar flow members 6 extending in the horizontal direction are arranged in parallel with each other at previously set intervals in the vertical direction such that the cooling medium can flow. The laminar flow member 20 is formed in a mesh shape, namely a grid shape, for example by use of platy members which are arranged in parallel with each other at previously set intervals in the vertical direction and extend in the horizontal direction, and platy members which are arranged in parallel with each other at previously set intervals in the horizontal direction and extend in the vertical direction. In addition, since the turbulent flow section 4 is the same as in the case of the first preferred embodiment, the description thereof will be omitted.

As thus described, in the semiconductor cooling device 1B according to the second preferred embodiment, provision of the mesh laminar flow member 20 in the region of the semiconductor chip 10a-mounted side in the laminar flow section 3 leads to a large surface area of the heat-generating side in the laminar flow section 3, thus making it possible to improve the cooling efficiency especially in the laminar flow section 3 of the semiconductor cooling device 1B.

Figure 4:
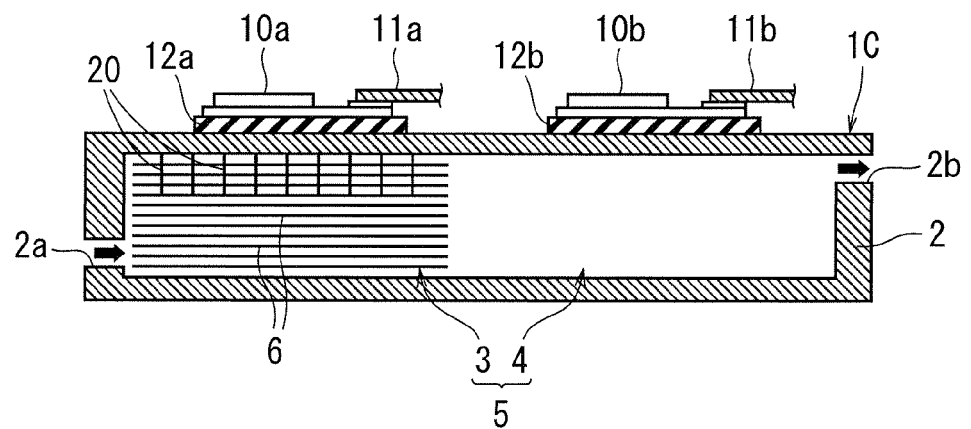
FIG. 4 is a sectional view of a semiconductor device provided with a semiconductor cooling device according to a modified example of the second preferred embodiment.

In addition, as shown in FIG. 4, the projections 7 may be omitted in the turbulent flow section 4. FIG. 4 is a sectional view of a semiconductor device provided with a semiconductor cooling device 1C according to a modified example of the second preferred embodiment. In this case, the cooling medium having been allowed to flow in the form of laminar flow from the laminar flow section 3 interferes in the turbulent flow section 4 and flows in the form of turbulent flow. Accordingly, the difference in thermal stress based on the temperature difference in the semiconductor device becomes small, thus making it possible to extend a power cycle life, and further to seek for a longer life of the semiconductor device.

Third Preferred Embodiment

Figure 5:
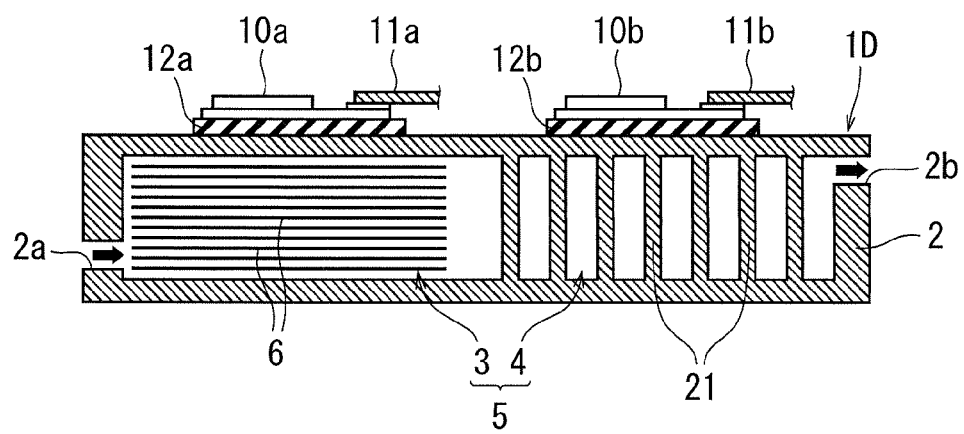
FIG. 5 is a sectional view of a semiconductor device provided with a semiconductor cooling device according to a third preferred embodiment.

Next, a semiconductor cooling device 1D according to a third preferred embodiment will be described. FIG. 5 is a sectional view of a semiconductor device provided with the semiconductor cooling device 1D according to the third preferred embodiment. It should be noted that in the third preferred embodiment, the same constitutional elements as those described in the first and second preferred embodiments are provided with the same reference numerals and the descriptions thereof will be omitted.

In the semiconductor cooling device 1D according to the third preferred embodiment, a pillar member 21 is provided in the turbulent flow section 4. More specifically, for example, a plurality of pillar members 21 extending in the vertical direction are arranged in the turbulent flow section 4. In FIG. 5, for example, the plurality of pillar members 21 are formed from the front side to the rear side of the turbulent flow section 4 at previously set intervals, while being formed in the turbulent flow section 4 from the boundary with the laminar flow section 3 to the outlet 2b-side peripheral region at previously set intervals.

The cooling medium having been allowed to flow from the laminar flow section 3 is collided with the pillar members 21, and hence the cooling medium flows in the form of turbulent flow inside the turbulent flow section 4, and is discharged from the outlet 2b. In addition, since the laminar flow section 3 is the same as in the case of the first preferred embodiment, the description thereof will be omitted. Further in the turbulent flow section 4, the cooling medium may only be allowed to flow in the form of turbulent flow, and the plurality of pillar members 21 may each be arranged at random, or the number of pillar members 21 may not be restricted to plural but may be one.

As thus described, in the semiconductor cooling device 1D according to the third preferred embodiment, provision of the pillar member 21 in the turbulent flow section 4 leads to a large surface area of the turbulent flow section 4, thus making it possible to improve the cooling efficiency especially in the turbulent flow section 4 of the semiconductor cooling device 1D. Further, provision of the pillar member 21 in the turbulent flow section 4 leads to enforcement of the turbulent flow section 4, thereby to improve the durability of the turbulent flow section 4 against water pressure of the cooling medium that flows through the turbulent flow section 4.

Fourth Preferred Embodiment

Figure 6:
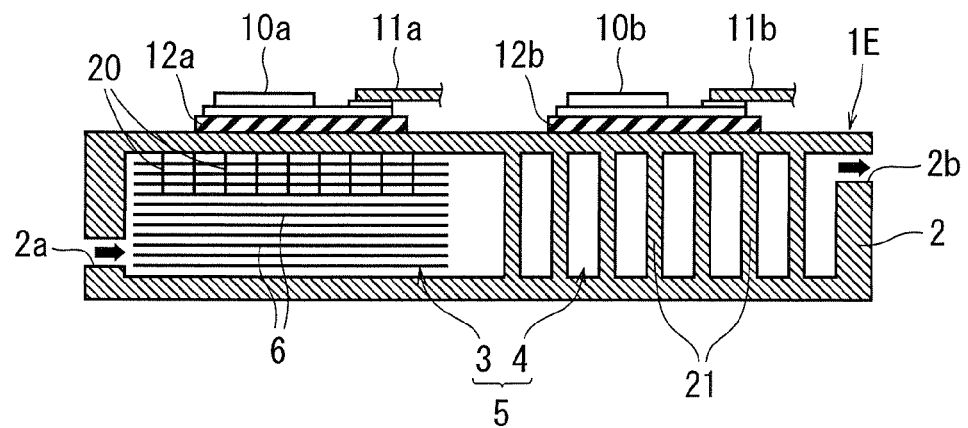
FIG. 6 is a sectional view of a semiconductor device provided with a semiconductor cooling device according to a fourth preferred embodiment.

Next, a semiconductor cooling device 1E according to a fourth preferred embodiment will be described. FIG. 6 is a sectional view of a semiconductor device provided with the semiconductor cooling device 1E according to the fourth preferred embodiment. It should be noted that in the fourth preferred embodiment, the same constitutional elements as those described in the first to third preferred embodiments are provided with the same reference numerals and the descriptions thereof will be omitted.

In the semiconductor cooling device 1E according to the fourth preferred embodiment, the mesh laminar flow member 20 is arranged in the laminar flow section 3 as in the case of the second preferred embodiment, while the plurality of pillar members 21 extending in the vertical direction are arranged in the turbulent flow section 4 as in the case of the third preferred embodiment, and the descriptions of the laminar flow section 3 and the turbulent flow section 4 will be omitted.

As thus described, in the semiconductor cooling device 1E according to the fourth preferred embodiment, provision of the mesh laminar flow member 20 in the region of the semiconductor chips 10a, 10b-mounted side in the laminar flow section 3 leads to a large surface area of the heat-generating side in the laminar flow section 3, thus making it possible to improve the cooling efficiency especially in the laminar flow section 3 of the semiconductor cooling device 1E.

Further, provision of the pillar member 21 in the turbulent flow section 4 leads to a large surface area of the turbulent flow section 4, thus making it possible to improve the cooling efficiency especially in the turbulent flow section 4 of the semiconductor cooling device 1E. Moreover, provision of the pillar member 21 in the turbulent flow section 4 leads to improvement in durability of the turbulent flow section 4 against water pressure of the cooling medium that flows through the turbulent flow section 4.

It is to be noted that in the present invention, respective preferred embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor cooling device for cooling a semiconductor chip mounted with an insulating layer being interposed therebetween, comprising:
   a cooling medium flow channel, through which a cooling medium for cooling said semiconductor chip flows;
   a laminar flow section that is provided in an upstream region of said cooling medium flow channel and allows said cooling medium to flow in the form of laminar flow;
   a turbulent flow section that is provided in a region downstream of said laminar flow section in said cooling medium flow channel and allows the cooling medium, which flows in the form of laminar flow from said laminar flow section, to flow in the form of turbulent flow;
   a projection that spans only a part of an interior of the semiconductor cooling device is positioned in a region of a semiconductor chip-mounted side in said turbulent flow section;
   an inlet positioned a first spaced distance away from said semiconductor chip-mounted side; and
   an outlet positioned a second spaced distance from said semiconductor chip-mounted side, said second spaced distance configured to be less than the first spaced distance.

2. The semiconductor cooling device of claim 1, wherein the projection extends a third spaced distance, the third spaced distance configured to be greater than the second spaced distance and less than the first spaced distance.

3. The semiconductor cooling device of claim 2, wherein the cooling medium flow channel extends over a fourth distance in a direction that is perpendicular to the semiconductor chip-mounted side, and the third spaced distance is less than half the fourth distance.

4. The semiconductor cooling device of claim 2, wherein the projection is a plurality of projections, and each projection of the plurality of projections extends the third spaced distance.

5. The semiconductor cooling device of claim 2, wherein the projection is a plurality of projections, and each projection of the plurality of projections is positioned at a set interval with respect to adjacent projections.

6. The semiconductor cooling device of claim 1, wherein the cooling medium flow channel extends over a fourth distance in a direction that is perpendicular to the semiconductor chip-mounted side, and the fourth distance in an area of the cooling medium flow channel adjacent to the inlet and in an area of the cooling medium flow channel adjacent to the outlet is the same.

7. The semiconductor cooling device of claim 1, wherein the projection extends to be in an overlapping configuration with the outlet, and a non-overlapping configuration with the inlet, when viewed from a side or elevation view.

8. The semiconductor cooling device of claim 1, wherein the projection is a plurality of projections arranged in set intervals along said cooling medium flow channel, from an upstream position of said semiconductor chip to a downstream position of said semiconductor chip.

9. The semiconductor cooling device of claim 8, wherein a gap extending in an upstream direction exists between a projection at the upstream position of said semiconductor chip and said laminar flow section.

10. A semiconductor cooling device for cooling a semiconductor chip mounted with an insulating layer being interposed therebetween, comprising:
    a cooling medium flow channel, through which a cooling medium for cooling said semiconductor chip flows, the cooling medium flow channel configured to extend over a first distance away from a semiconductor chip-mounted side;
    a laminar flow section that is provided in an upstream region of said cooling medium flow channel and allows said cooling medium to flow in the form of laminar flow;
    a turbulent flow section that is provided in a region downstream of said laminar flow section in said cooling medium flow channel and allows the cooling medium, which flows in the form of laminar flow from said laminar flow section, to flow in the form of turbulent flow;
    an inlet positioned a second spaced distance away from said semiconductor chip-mounted side;
    an outlet positioned a third spaced distance from said semiconductor chip-mounted side; and a projection that spans less than half the first distance is positioned in a region of a semiconductor chip-mounted side in said turbulent flow section.

11. The semiconductor cooling device of claim 10, wherein the projection extends a fourth spaced distance, the fourth spaced distance configured to be greater than the third spaced distance and less than the second spaced distance.

12. The semiconductor cooling device of claim 11, wherein the projection is a plurality of projections, and each projection of the plurality of projections extends the fourth spaced distance.

13. The semiconductor cooling device of claim 11, wherein the projection is a plurality of projections, and each projection of the plurality of projections is positioned at a set interval with respect to adjacent projections.

14. The semiconductor cooling device of claim 10, wherein the first distance in an area of the cooling medium flow channel adjacent to the inlet and in an area of the cooling medium flow channel adjacent to the outlet is the same.

15. The semiconductor cooling device of claim 10, wherein the projection extends to be in an overlapping configuration with the outlet, and a non-overlapping configuration with the inlet, when viewed from a side or elevation view.

16. The semiconductor cooling device of claim 11, wherein a ratio of the fourth distance to the first distance is approximately 30%.

17. The semiconductor cooling device of claim 10, wherein the projection is a plurality of projections arranged in set intervals along said cooling medium flow channel, from an upstream position of said semiconductor chip to a downstream position of said semiconductor chip.

18. The semiconductor cooling device of claim 17, wherein a gap extending in an upstream direction exists between a projection at the upstream position of said semiconductor chip and said laminar flow section.

* * * * *